United States Patent [19]
Whitmire et al.

[11] Patent Number: 5,175,531
[45] Date of Patent: Dec. 29, 1992

[54] BATTERY CONDITION MONITORING SYSTEM FOR BATTERIES CONNECTED IN PARALLEL

[76] Inventors: Warren T. Whitmire, 3 Longwood Dr., Shalimar, Fla. 32579; Larry T. Anderson, 720 E. Sunset Blvd., Ft. Walton Beach, Fla. 32548

[21] Appl. No.: 588,015

[22] Filed: Sep. 25, 1990

[51] Int. Cl.⁵ .............................................. G08B 21/00
[52] U.S. Cl. .................................. 340/636; 324/434; 320/48; 340/661
[58] Field of Search ........................ 340/636, 661, 660; 324/433, 434; 320/48; 307/43; 361/78, 87

[56] References Cited

U.S. PATENT DOCUMENTS

| | | | |
|---|---|---|---|
| 4,316,185 | 2/1982 | Watrous et al. | 340/661 X |
| 4,823,086 | 4/1989 | Whitmire et al. | 324/434 |
| 4,839,633 | 6/1989 | Krenik | 340/661 |

Primary Examiner—Jin F. Ng
Assistant Examiner—Jeffery A. Hofsass
Attorney, Agent, or Firm—Hale and Dorr

[57] ABSTRACT

Disclosed is a battery condition monitoring system that monitors the condition of batteries connected in parallel in order to determine that each battery is generating the necessary power. The system determines the difference in voltages that are proportional to the currents generated by the batteries. The system compares the voltage difference between the currents that is a positive value to a predetermined reference voltage which is the maximum allowed difference in the battery currents. If the positive difference value is greater than the reference voltage, one or more LEDs will illuminate indicating that one or more of the batteries is weak or defective, uniquely identifying the battery or batteries.

10 Claims, 2 Drawing Sheets

BATTERY CONDITION MONITORING SYSTEM FOR BATTERIES CONNECTED IN PARALLEL

BACKGROUND OF THE INVENTION

The present invention relates to a battery status or power condition indicating, system and more particularly to a system for determining the status or power condition of each battery in a multi-battery power pack in which the batteries are connected in parallel.

U.S. Pat. No. 4,823,086 to Whitmire et al discloses a battery monitoring and condition indicator for a multi-battery pack in which the batteries are connected in series. The system monitors the condition of each battery in the multi battery pack to determine if any batteries in the battery pack are weakening.

Certain applications, however, such as diesel trucks and boats, require the use of a multi-battery battery pack in which the batteries are connected in parallel. Batteries are connected in parallel in such applications in order to increase the cranking amperage. In addition, in such parallel connected multi-battery battery packs, if all of the batteries are not providing the necessary power, due to one or more defective batteries, the vehicle may fail to start without warning. Since the batteries are connected in parallel, a voltage indicator will show the voltage of the battery in the best condition and provide no indication of the status of any other batteries in the parallel connection.

SUMMARY OF THE INVENTION

The battery condition monitoring system of the present invention monitors the condition of batteries connected in parallel in order to determine that each battery is generating the necessary power. The system determines the difference in voltages that are proportional to the currents generated by the batteries. The system compares the voltage difference between the currents that is a positive value to a predetermined reference voltage which is the maximum allowed difference in the battery currents. If the positive difference value is greater than the reference voltage, one or more LEDs will illuminate indicating that one or more of the batteries is weak or defective, uniquely identifying the battery or batteries.

These and other features and objects of the present invention will be more fully understood from the following detailed description which should be read in light of the accompanying drawings in which corresponding reference numerals refer to corresponding parts throughout the several views.

DETAILED DESCRIPTION OF THE PREFERRED EMBODIMENTS

The battery condition monitoring system of the present invention checks the relative conditions of at least two chargeable batteries that are connected to each other in parallel. While the invention can be used with multi-battery packs having any number of batteries, the invention will be described in connection with a battery pack having only two batteries.

Figure 1:
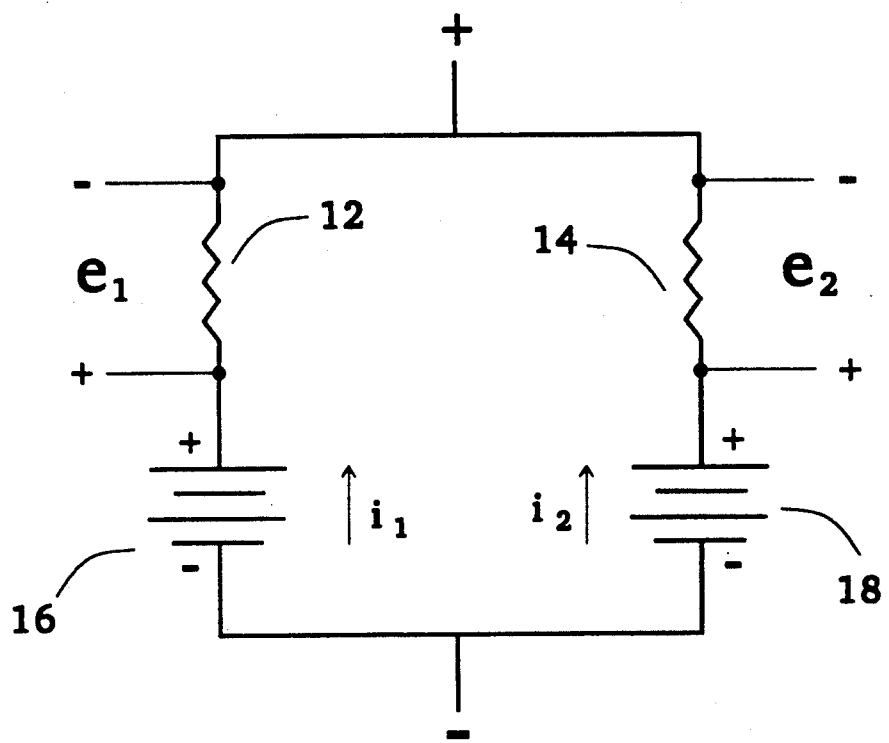
FIG. 1 is a schematic view of the front end of the battery condition monitoring system of the present invention.
Figure 2:
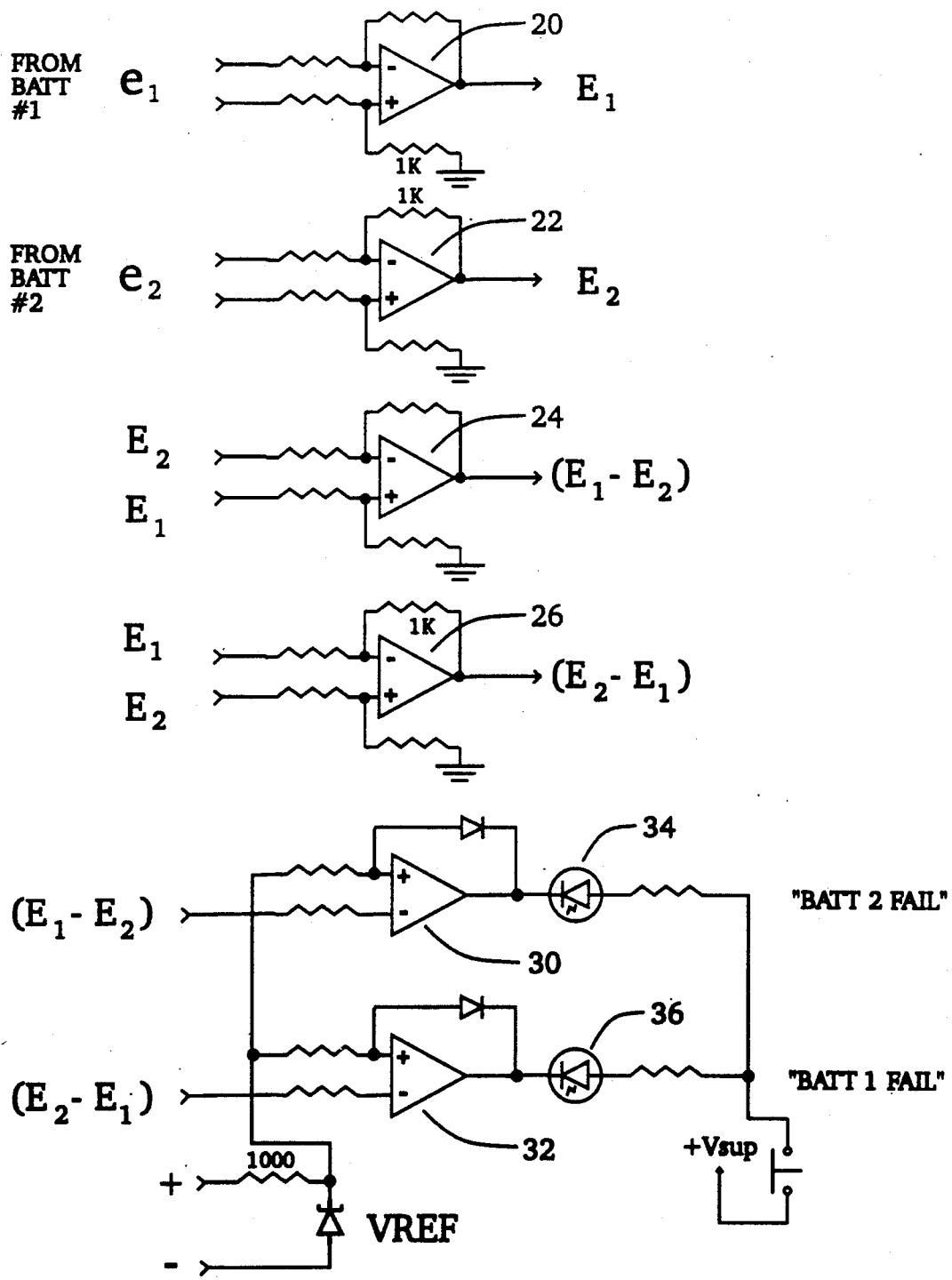
FIG. 2 is a schematic view of the circuitry of the portion of the system of the battery condition monitoring system of the present invention that determines the differences in voltages and triggers the indicating LEDs.

Referring to FIG. 1, shunts 12, 14 are connected in series with batteries 16, 18 respectively so that voltages $e_1$, $e_2$, may be obtained which are proportional to the respective battery currents. Referring to FIG. 2, voltages $E_1$ and $E_2$ are amplified by amplifiers 20, 22, respectively, to produce voltages $E_1$, $E_2$.

Voltages $E_1$, $E_2$, are subtracted in amplifiers 24, 26 so that the output of amplifier 24 is equal to $E_1 - E_2$ and the output of an amplifier 26 is equal to $E_2 - E_1$. These voltage differences represent the differences in the battery currents. If $E_1$ is greater than $E_2$, then the output from amplifier 24 will be positive, and if voltage $E_1$ is less than voltage $E_2$, then the output from amplifier 26 will be positive. Whenever the parallel set of batteries is loaded (such as cranking a truck), if both batteries are not carrying their share of the load, the current will differ causing the output of amplifiers 24 or 26 to rise.

Comparators 30, 32 are set to switch whenever the difference between voltages $E_1$ and $E_2$ is greater than $V_{ref}$. $V_{ref}$ is set for the maximum allowed difference in battery currents. If the voltage $E_1$ is greater than voltage $E_2$ by the $V_{ref}$ amount, then LED$^{34}$ will illuminate indicating that battery 18 is defective. Likewise, if voltage $E_2$ is greater than voltage $E_1$ by the same amount LED$^{36}$ will illuminate. Because of the latching effect of the diodes, the LEDs will stay illuminated until reset by depressing switch 37.

While the foregoing invention has been described with reference to its preferred embodiments, various alterations and modifications such as a digital readout identifying the faulty battery will occur to those skilled in the art. All such alterations and modifications are intended to fall within the scope of the appended claims.

What is claimed is:

1. A system for monitoring the condition of at least two batteries connected in parallel under load, said system comprising:

means for obtaining a voltage for each battery proportional to the current generated by each battery;

means for determining whether said battery current generated by one of said batteries exceeds said battery current generated by another of said batteries by more than a maximum allowable amount;

means for providing a visible indication whenever the current generated by one battery exceeds said battery current generated by said another battery by more than the maximum allowable amount.

2. The system for monitoring the condition of at least two batteries of claim 1 wherein said means for determining whether the battery current generated by one battery exceeds the battery current generated by said another battery comprises:

means for calculating the difference ($E_1 - E_2$) between a voltage $E_1$ which is proportional to the current produced by said one battery and a voltage $E_2$ which is proportional to the current produced by said another battery;

means for calculating the difference ($E_2 - E_1$) between the voltage $E_2$ produced by said one battery and the voltage $E_1$ produced by said another battery;

means for determining whether either difference ($E_1 - E_2$) or ($E_2 - E_1$) is positive;

means for comparing the difference $(E_1-E_2)$ or $(E_2-E_1)$ that is positive to a set reference level which represents said maximum allowable amount; and means for providing an indication and positive identification of a faulty battery when said positive difference exceeds said set reference level.

3. The system for monitoring the condition of at least two batteries of claim 1 wherein said means for providing a visible indication comprises a first means for indicating that said one battery is defective or weak when current produced by said another battery exceeds current produced by said one battery;

second means for indicating that said other battery is defective or weak when current produced by said one battery exceeds current produced by said another battery.

4. The system for monitoring the condition of at least two batteries of claim 3 wherein said first and second means for indicating are light emitting diodes.

5. The system for monitoring the condition of at least two batteries of claim 1 wherein said means for providing a visible indication comprises means for latching said visible indication so that the visible indication will remain visible until said system is reset.

6. A system for monitoring the condition of two batteries connected in parallel under load, said system comprising:

means for obtaining a voltage for each battery proportional to the current generated by each battery;

means for determining whether said battery current generated by one of said batteries exceeds said battery current generated by the other battery by more than a maximum allowable amount;

means for providing a visible indicator whenever the current generated by said one battery exceeds said battery current generated by said other battery by more than the maximum allowable amount.

7. The system for monitoring the condition of two batteries of claim 6 wherein said means for determining whether the battery current generated by one battery exceeds the battery current generated by said other battery comprises:

means for calculating the difference $(E_1-E_2)$ between a voltage $E_1$ which is proportional to the current produced by said one battery and a voltage by $E_2$ which is proportional to the current produced by said other battery;

means for calculating the difference $(E_2-E_1)$ between the voltage $E_1$ produced by said one battery and the voltage $E_1$ produced by said other battery;

means for determining whether either difference $(E_1-E_2)$ or $(E_2-E_1)$ is positive;

means for comparing the difference $(E_1-E_2)$ or $(E_2-E_1)$ that is positive to a set reference level which represents said maximum allowable amount; and means for providing an indication of a faulty battery when said positive difference exceeds said set reference level.

8. The system for monitoring the condition of two batteries of claim 6 wherein said means for providing a visible indication comprises a first means for indicating that said one battery is defective or weak when current produced by said other battery exceeds current produced by said one battery;

second means for indicating that said other battery is defective or weak when current produced by said one battery exceeds current produced by said other battery.

9. The system for monitoring the condition of two batteries of claim 8 wherein said first and second means for indicating are light emitting diodes.

10. The system for monitoring the condition of two batteries of claim 6 wherein said means for providing a visible indication comprises means for latching said visible indication so that the visible indication will remain visible until said system is reset.

* * * * *